United States Patent
Killion

(10) Patent No.: US 9,222,827 B2
(45) Date of Patent: Dec. 29, 2015

(54) METHOD AND SYSTEM FOR AN ULTRA LOW POWER DOSIMETER

(75) Inventor: Mead C. Killion, Elk Grove Village, IL (US)

(73) Assignee: ETYMOTIC RESEARCH, INC., Elk Grove Village, IL (US)

( * ) Notice: Subject to any disclaimer, the term of this patent is extended or adjusted under 35 U.S.C. 154(b) by 1230 days.

(21) Appl. No.: 12/945,468

(22) Filed: Nov. 12, 2010

(65) Prior Publication Data

US 2011/0056299 A1    Mar. 10, 2011

Related U.S. Application Data

(62) Division of application No. 11/717,519, filed on Mar. 13, 2007, now Pat. No. 7,836,771.

(60) Provisional application No. 60/781,905, filed on Mar. 13, 2006.

(51) Int. Cl.
*G01H 3/14* (2006.01)

(52) U.S. Cl.
CPC ........................................ *G01H 3/14* (2013.01)

(58) Field of Classification Search
CPC ......... G01H 3/14; H04R 1/1016; A61B 5/121
USPC ................................ 73/647; 381/56; 600/559
See application file for complete search history.

(56) References Cited

U.S. PATENT DOCUMENTS

| | | | | | |
|---|---|---|---|---|---|
| 3,681,618 | A | * | 8/1972 | Blackmer | 327/352 |
| 4,307,385 | A | * | 12/1981 | Evans et al. | 340/540 |
| 5,046,101 | A | * | 9/1991 | Lovejoy | 381/57 |
| 5,420,581 | A | * | 5/1995 | Peters et al. | 340/573.1 |
| 6,507,650 | B1 | * | 1/2003 | Moquin | 379/387.01 |
| 6,826,515 | B2 | * | 11/2004 | Bernardi et al. | 702/191 |
| 2007/0180915 | A1 | * | 8/2007 | Goldberg et al. | 73/647 |

* cited by examiner

*Primary Examiner* — Laura Martin
*Assistant Examiner* — Rose M Miller
(74) *Attorney, Agent, or Firm* — McAndrews, Held & Malloy, Ltd.

(57) ABSTRACT

Certain embodiments of the invention may be found in an ultra low power dosimeter assembly. The ultra low power dosimeter assembly may comprise a low power voltage source and a table circuit. The table circuit may be adapted to convert an input voltage to a second voltage level. The second voltage level may correspond to noise dose. The ultra low power dosimeter assembly may also comprise a switch adapted to trigger a control circuit. The control circuit may provide progressive attenuation of an output signal as the second voltage level increases. In certain embodiments, the control circuit may also be adapted to send one or more warning signals to a user of the ultra low power dosimeter. The one or more warning signals may be sent when the control circuit determines the second voltage level has reached one or more pre-determined threshold voltage levels.

7 Claims, 4 Drawing Sheets

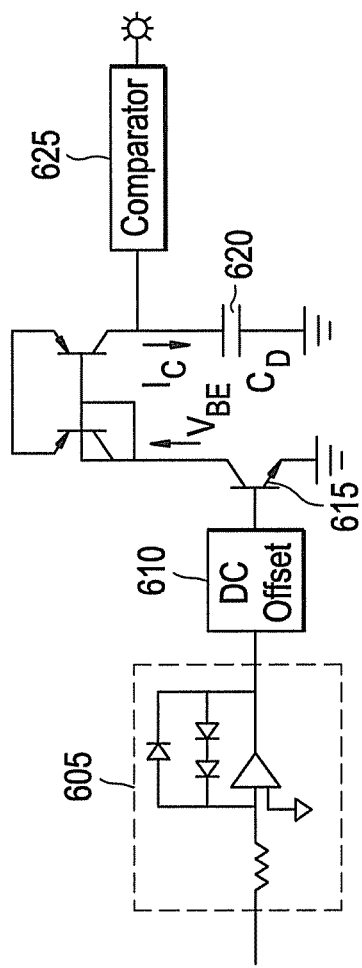
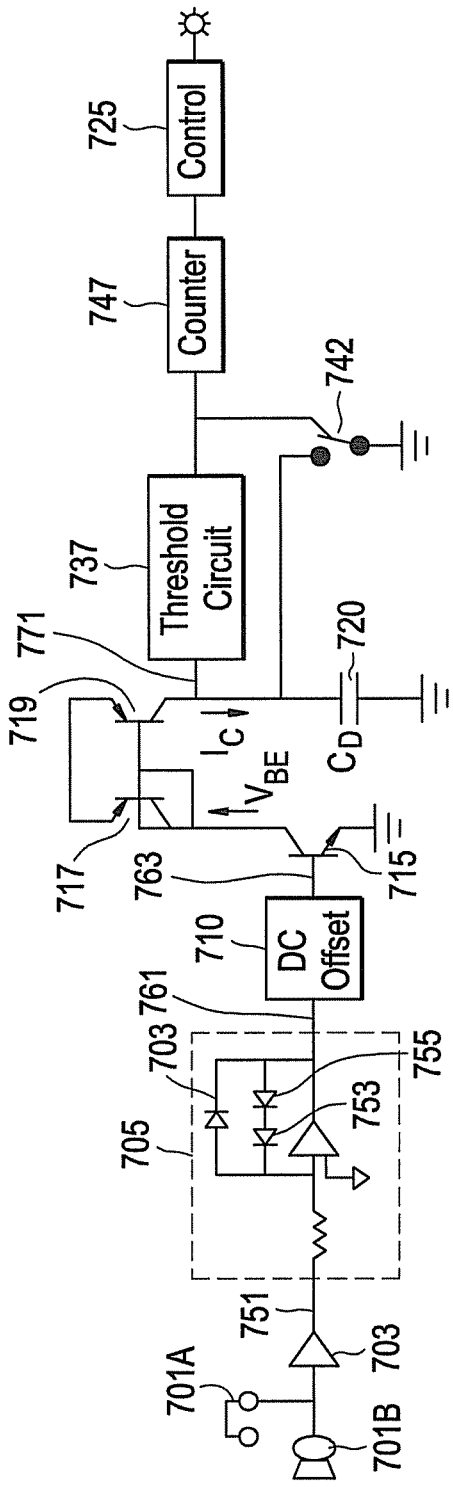

METHOD AND SYSTEM FOR AN ULTRA LOW POWER DOSIMETER

CROSS-REFERENCE TO RELATED APPLICATIONS/INCORPORATION BY REFERENCE

The present application is a divisional and claims priority under 35 U.S.C. §121 to U.S. patent application Ser. No. 11/717,519, filed on Jan. 17, 2007, now U.S. Pat. No. 7,836,771, which claims priority under 35 U.S.C. §119(e) to provisional application Ser. No. 60/781,905, filed on Mar. 13, 2006. The entire contents of each above-mentioned prior-filed application is hereby expressly incorporated herein by reference.

FIELD OF THE INVENTION

Certain embodiments of the invention relate to noise monitoring. More specifically, certain embodiments of the invention relate to a method and system for an ultra low power dosimeter.

BACKGROUND OF THE INVENTION

A noise dosimeter is a device which incorporates a sound level measurement subsystem and a methodology for accumulating the sound level over time. ANSI S.125-1991 is the American National Standard Specification for Personal Noise Dosimeters, a comprehensive standard that describes how a standard noise dosimeter should function. The result of noise dosimeter integration may be what is known as the "equivalent continuous sound level", denoted as $L_{eq}$. A noise dose might also be expressed as a percentage of "criterion exposure." In terms of Pascals (the mks standard unit of sound pressure, the Pascal (Pa)), the criterion exposure recommended as safe in NIOSH-1998 is a maximum of 3640 $Pa^2s$ per day. Where s denotes the time in seconds and $Pa^2$ is the instantaneous power. The "criterion sound level" is the level of sound, which continuously applied for eight hours results in 100% criterion exposure. A Sound Pressure Level of 85 dB SPLA will produce 3640 $Pa^2s$ at the end of eight hours. These calculations are completely specified in the standard and are well known in the industry.

Many environments expose individuals to excessively loud sounds. These loud sounds include, for example, music concerts, industrial manufacturing environments, construction and environments involving the use of heavy machinery, etc. The US government regulates, through OSHA (Occupational Safety and Health Administration), noise exposure levels in work environments. There are many noise dosimeters on the market, which are used to monitor noise in the work environment. These regulations and devices represent a level of protection for many American workers.

Additionally, with the increased use of personal audio players with earphones such as iPods and other portable audio devices, and earphones in general (in a plane, watching a movie with the sound of the engine in the background) the exposure to noise is drastically greater. To be able to hear their music in a noisy environment, listeners may increase the volumes of their music or movies to levels that can be damaging to their hearing without realizing the dangers associated with the loud sounds in their ears. For example, in an aircraft cabin, the noise levels tend to be 75-80 dBA SPL, which often induce passengers to increase the volume in their open-ear airline earphones to levels of 85-95 dBA SPL. A level of 91 dB for 4 hours exceeds by 200% the recommended daily exposure using NIOSH-1998 recommended criteria. Noise-excluding earphones help reduce risk, but a few listeners appear to have become addicted to loud sounds. (Florentine et al., Ear & Hearing 1998; 19; 420-428).

Applicant has found that live orchestral music such as, for example, that heard in an Orchestra Hall when the Chicago Symphony Orchestra is playing a piece such as Stravinski's Rite of Spring or Berlios' Damnation of Foust, can produce a sound pressure level (SPL) of 102 to 104 dB at an audience seat in the first balcony of Chicago's Orchestra Hall. An earphone that can accurately reproduce such music, must have an undistorted output capability of 115 dB SPL (referred to the sound field equivalent) measured with sine-wave signals. That same earphone can cause hearing damage if listened to at full volume while playing music that tends to stay at the same level all the time. Unfortunately, listeners often do not know when their ears are at risk. The need for a personal device that alerts a user when noise surpasses a recommended safe level is therefore becoming a necessity.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

An ultra low power dosimeter assembly is provided, substantially as shown in and/or described in connection with at least one of the figures, as set forth more completely in the claims.

A method for monitoring noise dose using an ultra low power dosimeter is provided, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 6 illustrates an exemplary circuit of the control circuitry in the ultra low power dosimeter, in accordance with an embodiment of the present invention.

FIG. 7 illustrates an exemplary circuit for obtaining the $Pa^2$ energy equivalent of the input Sound Pressure Level and applying it repeatedly to an integrating capacitor so that after a certain number of charge-discharge cycles an alarm is sounded, in accordance with an embodiment of the present invention.

DETAILED DESCRIPTION OF THE INVENTION

Figure 1:
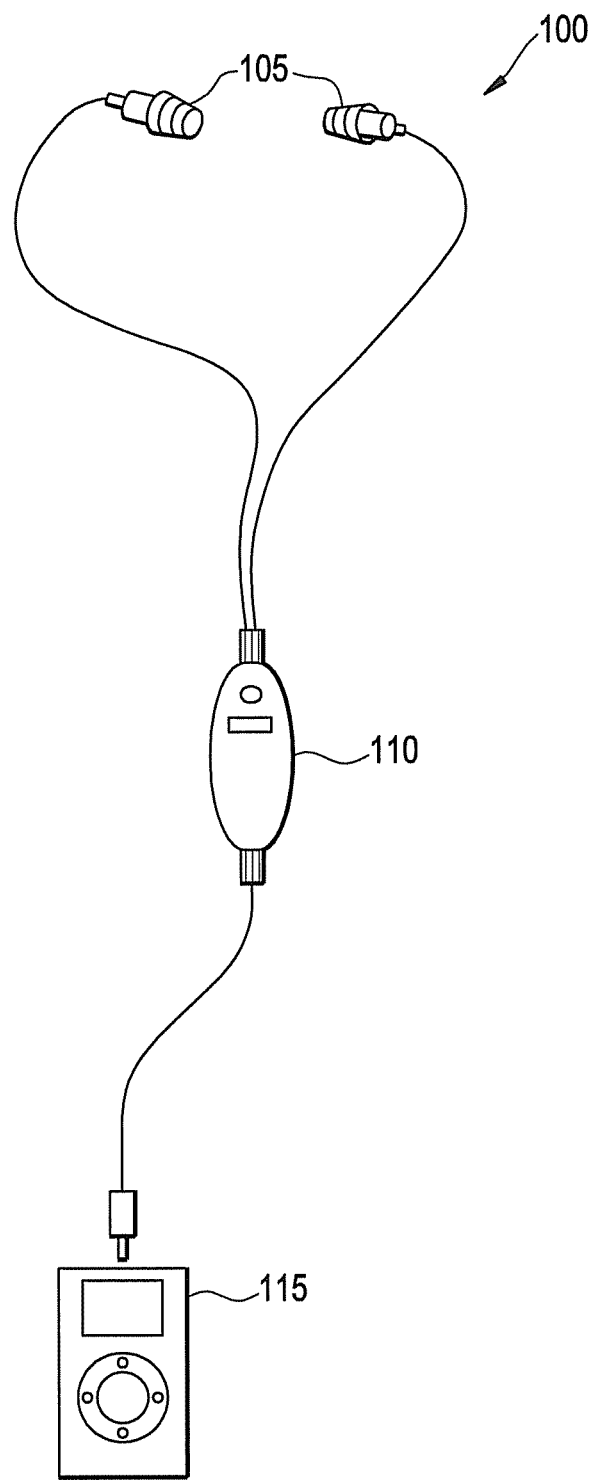
FIG. 1 illustrates a diagram of an exemplary ultra low power dosimeter, in accordance with an embodiment of the present invention.

Certain embodiments of the invention may be found in a method and system for a personal noise dosimeter. More specifically, the present invention relates to a system and method for an ultra low power dosimeter.

The ultra low power dosimeter of the present invention may be used in earphones to warn the person using the earphones that the allowable noise exposure level has been reached. The warning may be indicated using, for example, a blinking LED or by sending an audible distinct signal through the earphones. The ultra low power dosimeter may comprise a dosimeter circuit, which may be low-power enough and small enough to operate using a small power source such as, for example, a watch battery, and fit inside earphones or be added to the earphone path to an audio device without too much adding extra bulkiness or weight.

Similarly, because the power consumption of the ultra low power dosimeter is on the order of that of watches with LCD displays, and the size of the circuit of the ultra low power dosimeter is such that it could readily be added along with a subminiature hearing aid microphone to watches such as, for example, the Timex "Ironman" triathalon watch, the ultra low power dosimeter can be readily added to many watch designs. Therefore, giving the wearer a reading on the display of the dosage so far that day, the predicted 8-hour dosage, and the time to allowable dosage in the present noise or music environment. By use of "cow tag" interrogation systems, the dosimeter may be interrogated remotely without increasing the battery drain of the watch or mp3 player.

In an embodiment of the present invention, the user of the earphones may be warned with a tone, or a flashing LCD when the user's exposure has reached the allowable limit. That limit may be set into the circuit as described hereinafter. Another warning signal may be to interrupt the music or the audio that they user is listening to, for a short time, and that may be done repeatedly until the user reduces the sound level. The warnings may differ depending on the level of exposure. For example, a warning at 50% exposure may be an interruption of 500 msec every minute; whereas, a warning at 100% exposure may be a long and more frequent interruption of the music, or whatever audio the user is listening to.

An embodiment of the present invention may utilize, for example, the bipolar integrated circuit K-AMP technology as described by U.S. Pat. No. 5,131,046. The K-AMP technology may be readily modified to perform the required pressure squared power root-mean-square (RMS) detection and integration to provide the desired dosimeter function. Additionally, a low-power CMOS chip may be utilized for any digital portions of the circuitry of the system.

An embodiment of the present invention may comprise a system that samples sound levels in terms of voltage of headphones, earphones, or microphones. The voltage from the left and right earphones may be averaged, for example, and used to determine the amount of exposure in the ear produced by the earphones. When the amount of exposure reaches 50%, for example, of the allowable sound exposure, the user may be warned using a warning signal.

FIG. 1 illustrates a diagram of an exemplary ultra low power dosimeter, in accordance with an embodiment of the present invention. The system 100 may comprise earphones 105 and the ultra low power dosimeter 110. The earphones 105 may be connected to the ultra low power dosimeter 110, which may in turn be connected to the audio source device 115. The device 115 may be for example a portable audio device such as, for example, a mobile radio or a music player device. The ultra low power dosimeter 110 may provide a dosimeter function or a sampling dosimeter function. U.S. Provisional Patent Application Ser. No. 60/760,564 filed Jan. 22, 2006 discusses an alternate method and system of a personal noise dosimeter.

Figure 2:
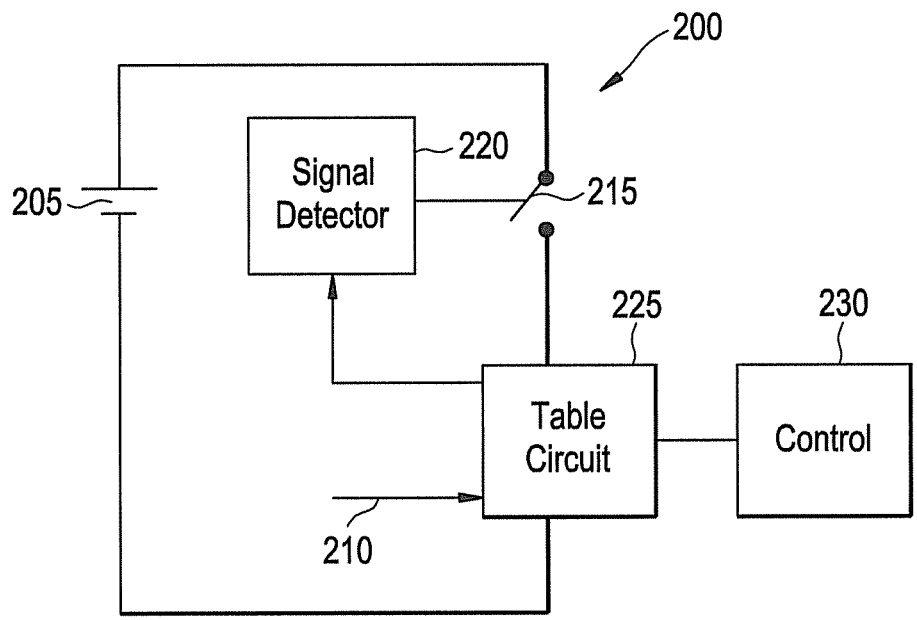
FIG. 2 illustrates a block diagram of an exemplary circuitry of an ultra low power dosimeter, in accordance with an embodiment of the present invention.

FIG. 2 illustrates a block diagram of an exemplary circuitry of an ultra low power dosimeter, in accordance with an embodiment of the present invention. The circuitry 200 may comprise a power source 205, an input 210, a switch 215, a signal detection block 220, a table circuit 225, and a control circuitry block 230. The input 210 may comprise an average of the voltage level of the sound coming from an audio source such as, for example, the audio source device 115 of FIG. 1. The power source 205 may be for example a small battery such as, for example, a battery used in a watch, providing a small voltage such as, for example, around 1.4 V. The input 210 may go into the table circuit 225 where the average voltage level may be converted to a second voltage level that corresponds to the time-integral of the RMS level of the sound. For example, a second voltage level of 100 mV may correspond to 100% of the allowable 8-hour dose of sound. A level of 200 mV and 400 mV may correspond to 200% and 400% of the allowable dose, respectively, and so on. The second voltage level may then be used by the signal detection block 220. When the signal detection block 220 senses that the average voltage level has reached the level corresponding to a level set to be a 50% exposure level, for example, 91 dBA SPL for one hour, the switch 215 may be closed and as a result the control circuitry block 230 is turned on. The control circuitry block 230 may then begin sending out warning signals to the user. Additionally, the control circuitry block 230 may continue examining the level of the input until a second pre-specified threshold level is reached. Once the second threshold level is reached, the control circuitry block 230 may begin sending out a more strident warning signal, indicating that the full allowable dose has been reached. This process may continue with each doubling of allowable dose.

An alternate approach may be to use the accumulated dose stored in table circuit 225 to activate switch 215 to trigger progressive levels of attenuation. When half the allowable dose is reached, for example, the control circuitry block 230 may introduce an attenuation of 3 dB into the signal path. When three-quarters of the allowable does has been reached, an additional 3 dB, for a total of 6 dB of attenuation may be applied. An additional 3 dB may be added at ⅞ths, ¹⁵⁄₁₆ths, etc. Proceeding in this manner, the output may not exceed (or even quite reach) the allowable dose, providing safe listening. It should be understood that the same result—automatic prevention of the total dose exceeding the allowable dose, may be reached using different numbers: for example adding 4 dB attenuation at 10% of the dose, another 4 dB at 20% of the dose, and so forth so that at 90% of the dose 36 dB has been added.

The table circuit 225 may include a logarithmic amplifier such as, for example, used in the K-AMP as described by U.S. Pat. No. 5,131,046. Such an amplifier can transform ac voltage e(mic) that is proportion to linear pressure P into a new voltage $e2=2*\log(e(mic))=\log(e(mic)^2$ that is proportional to the logarithm of the pressure squared. The circuitry in the control circuitry block 230 may utilize a capacitor that is charged proportionally to $Pa^2s$, the time integral of the sound energy. When the capacitor voltage reaches a threshold value corresponding to, for example, 50% of the allowable dose, switch 215 shuts off triggering one of the warning signals discussed hereinabove.

Figure 3:
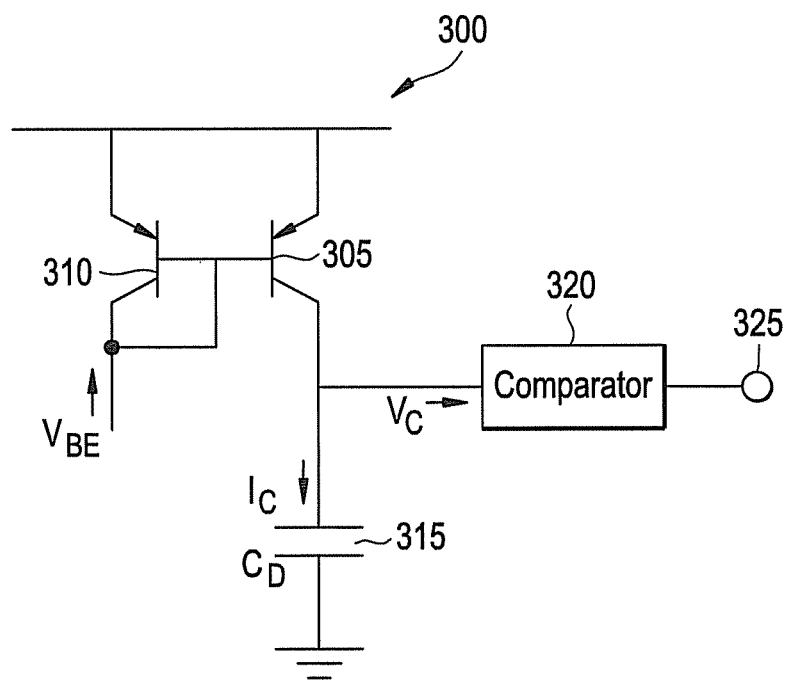
FIG. 3 illustrates an exemplary circuitry utilized in the control circuitry in an ultra low power dosimeter, in accordance with an embodiment of the present invention.

FIG. 3 illustrates an exemplary circuitry utilized in the control circuitry in an ultra low power dosimeter, in accordance with an embodiment of the present invention. The direct current voltage (DC) supplied to the transistors 305 and 310 may come from the power source 205 of FIG. 2. The voltage $V_{BE}$ may be applied to the circuitry 300 at a junction so that it may appropriately draw the current $I_C$, which may be proportional to $\log(e(\text{mic})^2)$. For example, if the input voltage 210, corresponding to the input sound level from the audio source increases by 10 dB, the voltage $V_{BE}$ on 310 may increase 60 mV so that charging current $I_C$ increases 10 fold, causing a 10 fold faster charging on the capacitor 315. As the capacitor charges and as the input voltage changes, $I_C$ also changes, resulting in a voltage, $V_C$. As the input voltage level continues to increase or remains at a high voltage level, the capacitor reaches a voltage that would equal a specified threshold voltage. Once the threshold voltage is reached, the warning signal will go off to indicate that the accepted dose has been reached. The warning signal may be controlled by a comparator circuit 320, which may utilize a comparator with specified voltage levels corresponding to certain levels of exposure. If the voltage is greater than a specified voltage corresponding to 50% exposure, for example, the comparator circuit 320 may send out a warning signal that may cause, for example, an LCD 325 to blink and/or indicate the dosage. If the voltage is greater than a voltage corresponding to a higher exposure level, the comparator circuit 320 may send out another warning signal that may cause, for example, the LCD to blink faster or longer.

In an embodiment of the present invention, the comparator circuit may be implemented digitally, wherein the comparator circuit may comprise a counter, wherein the counter may indicate the number of fractional doses accumulated. If the counter gets to a certain number, then that may be indicative that the minimum allowed exposure level has been reached, and may cause a warning signal to be activated, for example, a beep, or an attenuation introduced into the earphone signal. If the counter hits a larger number, indicating an even higher exposure level, the warning signal may be stronger such as, for example, more frequent beeps, or an increased attenuation to be introduced.

FIG. 7 illustrates an exemplary circuit for obtaining the $Pa^2$ power level equivalent of the input Sound Pressure Level and applying it repeatedly to an integrating capacitor so that after a certain number of charge-discharge cycles an alarm is sounded, in accordance with an embodiment of the present invention. Referring to FIG. 7, there is shown a more detailed schematic of an exemplary implementation of the circuitry shown in FIG. 2. $V_R$ may provide a reference voltage such as, for example, 0.2 VDC. The voltage output of in-the-ear microphone 701A or the voltage across earphones 701A may be proportional to the sound pressure to which the user is exposed. Amplifier 703 may amplify the microphone voltage or earphone voltage to a level suitable for input 751 of logarithmic rectifier 705. Diodes 753 and 755 may provide the squaring function, so that the voltage 761 at the output of logarithmic rectifier 705 increases 120 mV for each ten times increase in microphone voltage. The basic operation of such a rectifier is explained in U.S. Pat. No. 5,131,046. DC voltage shifting circuit 710 may be arranged such that the voltage applied to the base of transistor 715 may also increase 120 mV for each 10 times increase in microphone voltage. The resultant collector current in transistor 715 may be mirrored in transistors 717 and 719, with the desired result that the charging current $I_C$ into capacitor 720 is proportional to the square of the microphone voltage or earphone voltage (and thus the square of the pressure Pa).

When the voltage 771 on the capacitor 720 reaches a predetermined voltage, threshold circuit 737 may provide a trigger signal to circuitry 747 and warning/attenuation control circuit 725. Several threshold values may be employed. A 50 mV voltage 771 may correspond to 50% allowable dose, 100 mV to a 100% allowable dose, 200 mV to a 200% allowable dose, and so forth.

The circuitry of FIG. 7 may be designed such that leakage currents in the transistors and capacitor 720 may be extremely low, allowing an accurate 8-hour integration.

In some situations, it may be preferable to require less of the capacitor and transistors. In an embodiment, a digital counter may be used to effectively multiply the capacitance. For example if a 16 bit counter 747 is used with a 600 pF value for capacitor 720 and a charging current $I_C$ of 100 pA is applied, the capacitor may reach 426 mV in 14.1 seconds or 8/2048 hours. If in this example the capacitor is discharged each time a voltage of 426 mV is reached, after 1024 such charge-discharge cycles, the $10^{th}$ bit of counter 747 will switch to a "1" state. By appropriate choice of DC offset in circuit 710, 1024 discharge cycles may correspond to 50% of the allowable dose and the warning/attenuation control circuit 725 may provide a warning to the user, such as tone, light, temporary silence and/or start attenuation, among other things.

Threshold circuit 737 may provide a momentary closure of switch 742 when the threshold voltage (426 mV in the example above) is reached, which simultaneously discharges capacitor 720 and provides a trigger to counter 747. It should be noted that a circuitry containing 600 pF and delivering a 100 pA to 100 nA charging current may be practical in an integrated circuit, as would be the combination of 150 pF and 25 pA, which may provide the same time constant. Some modern bipolar integrated circuits, for example, may provide both NPN and PNP transistors with leakage currents in the fraction of a pA and gains (HFE) of 20 to 50 at 100 pA. Such performance made practical the LOBAT circuit described in U.S. Pat. Nos. 6,320,969; 6,453,051; and 6,704,424, which uses a 50 pF capacitor and bipolar transistors and may provide current-controlled time constant of tens of seconds.

If the charging current has been set so that 2048 discharge cycles correspond to a steady 85 dBA noise level for an eight hour period, and the counter has been set to zero at the start of the daily noise exposure, at the end of four hours of 85 dBA exposure, or 1024 discharge cycles, the $10^{th}$ bit of the counter will go from "zero" to "one," and warning/attenuation control circuit 725 will provide the desired warning to the user. Alternately, when the counter reaches 410 discharge cycles, corresponding to approximately 10% of the allowable daily dose in this example, the voltage to the earphones and thus the output SPL in the ear may be attenuated by, for example, 3 dB. This amount may be just barely noticeable to most users. After another 410 counts, corresponding to 20% of full dose, it might be reduced another 3 dB, another at 30%, etc., so that by 100% dose the gain has been reduced by 30 dB.

The warning signal may be, for example, a flashing LCD that flashes at a pattern according to the sound level and simultaneously provides the percent exposure reading as a numeric display. As the sound level gets larger than the 50% exposure sound level, the LCD may flash faster. Alternatively, the warning signal may be an audio indicator such as, for example, an audible beep or an interruption in the audio input in the earphones. The warning signal may induce the user to lower the volume of the audio source, hence lowering the sound level to a safe acceptable level. Instead of or in addition to an audible beep, the voltage to the earphones may be progressively attenuated so the user is automatically protected from accumulating unsafe total exposures.

The table below shows the sound level values and the value of the associated current ($I_C$) values that go through capacitor 720 in FIG. 7.

| SPL (dBA) | Microphone Voltage in (mV RMS) | Charge current (nA) | Time to charge $C_D$ (sec) |
|---|---|---|---|
| 85 | 3.5 | 0.1 | 14 |
| 88 | 5 | 0.2 | 7 |
| 91 | 7 | 0.4 | 3.5 |
| 95 | 10 | 1 | 1.4 |
| 105 | 32 | 10 | 0.14 |
| 115 | 100 | 100 | 0.014 |

The times to charge the capacitor $C_D$ correspond to a voltage of 0.427 VDC. The required charge current corresponding to a capacitor $C_D$ with a value of 600 pF may be determined according to the following equation:

$$\frac{dV}{dt} = \frac{i}{C}$$

Figure 4:
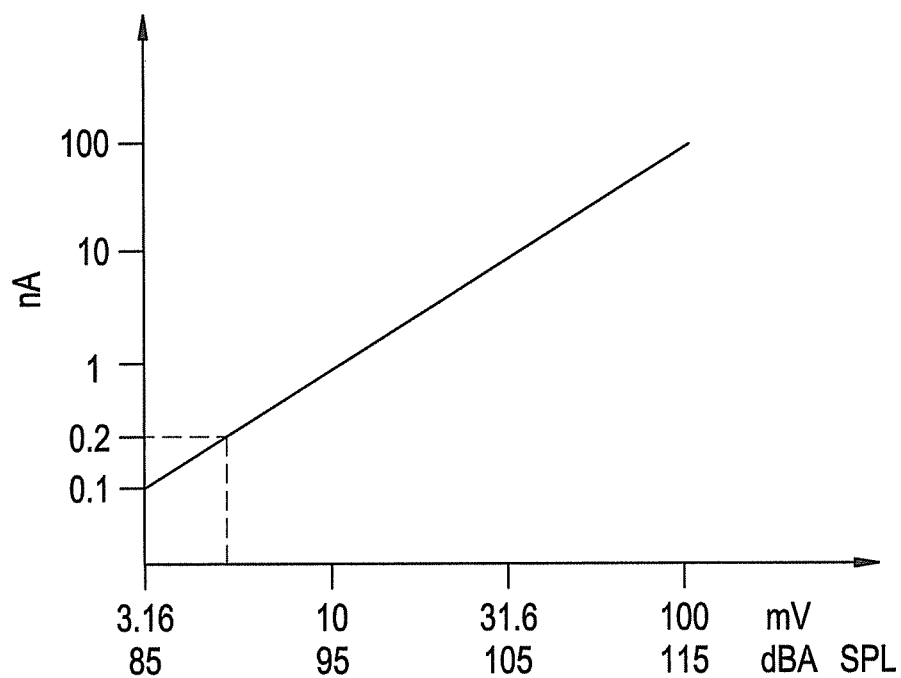
FIG. 4 illustrates an exemplary graphic plot of the charging current value into the capacitor versus the exposure level, in accordance with an embodiment of the present invention.

FIG. 4 illustrates an exemplary graphic plot of the charging current value into the capacitor versus the exposure level, in accordance with an embodiment of the present invention. Referring to FIG. 4, the typical AC RMS microphone output voltage corresponding to each exposure level, is also shown. An inexpensive subminiature electret condenser microphone having sensitivity −41 dBV/Pa has been illustrated. The input voltage from the earphones is also shown corresponding to the exposure level on the plot. For example, 85 dBA SPL may correspond to 3.16 mV, and 114 dBA SPL may correspond to 100 mV.

Figure 5:
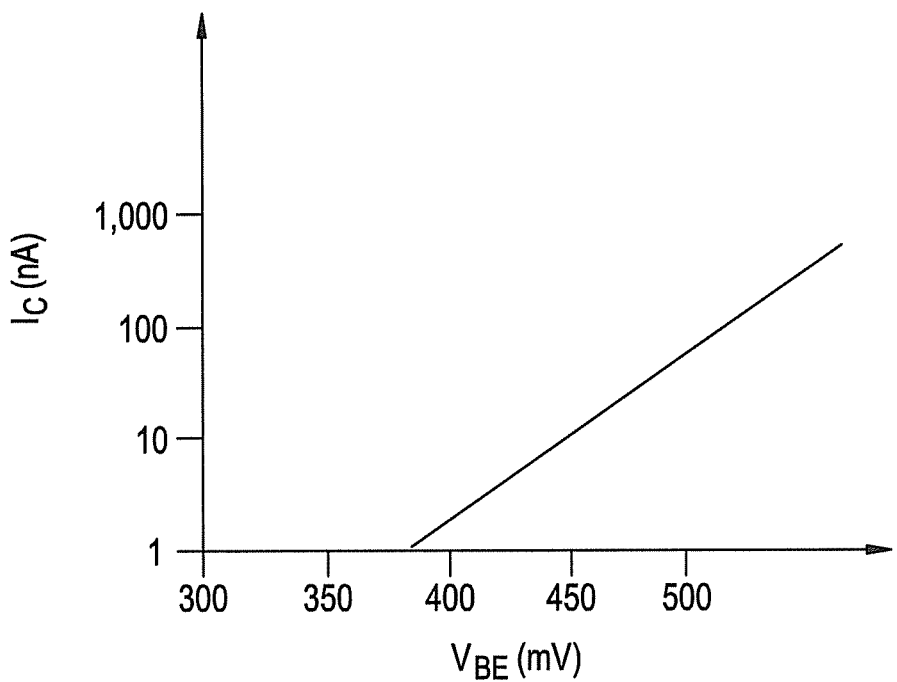
FIG. 5 illustrates an exemplary graphic plot of the current value through a capacitor-charging transistor versus the input voltage, in accordance with an embodiment of the present invention.

FIG. 5 illustrates an exemplary graphic plot of the current value through an ideal capacitor-charging transistor versus the input voltage, in accordance with an embodiment of the present invention. The following table shows the current through the capacitor and the corresponding input voltage:

| $I_C$ | $V_{BE}$ |
|---|---|
| 1 uA | 560 mV |
| 100 nA | 500 mV |
| 10 nA | 440 mV |
| 1 nA | 380 mV |
| 100 pA | 320 mV |
| 10 pA | 260 mV |
| 1 pA | 200 mV |
| 100 fA | 140 mV |
| 10 fA | 80 mV |

The voltage $V_{BE}$ may correspond to the logarithm of the squared microphone or earphone voltage, where a 3.16× increase in the voltage to the earphones is equivalent to a 10× increase in the pressure-squared exposure level and produces a change of 60 mV in $V_{BE}$ and a corresponding 10× increase in charging current Ic. The K-AMP circuit discussed above may be used for amplifying the voltage and producing an appropriate charging current according to the aforementioned pattern.

FIG. 6 illustrates an exemplary circuit of the control circuitry in the ultra low power dosimeter, in accordance with an embodiment of the present invention. The average voltage of the earphones may be amplified using the K-AMP circuit 605 as discussed above. It is well understood that transistor 615 is preferably an integrated circuit transistor and that its geometry and its emitter area may be adjusted over a wide range to produce the desired current at a given base-emitter voltage. Thus with a larger geometry, 1 nA might correspond to a 320 mV base-emitter voltage, for example. A DC offset 610 may be utilized following voltage amplification to drive the transistor 615 at the appropriate level determined by its geometry. For example, at 95 dB exposure level, the needed voltage applied to the base of exemplary transistor 615 would be the voltage corresponding to 1 nA, which is 380 mV. The supplied voltage $V_{BE}$ would then produce the current $I_C$, which would cause the capacitor $C_D$ 620 to charge. When the voltage through the capacitor 620 reaches the voltage level specified in the comparator 625, a warning signal may be set off to warn the user of the higher exposure level.

In an embodiment of the present invention, a digital counter may be utilized instead of a comparator. A larger count on the counter may indicate a higher exposure level. When a specified count is reached, thus indicating that the allowable exposure level has been passed, a warning signal may be set off to warn the user.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. An ultra low power dosimeter assembly, comprising:
   a circuit adapted to convert an input voltage to a second voltage level representing accumulated noise dose; and
   an attenuation control circuit adapted to provide pre-determined amounts of progressive attenuation of an output signal when the second voltage level representing accumulated noise dose reaches pre-determined threshold voltage levels, wherein each of the pre-determined threshold voltage levels corresponds with one of the pre-determined amounts of progressive attenuation.

2. The assembly of claim 1 further comprising a switch adapted to trigger the attenuation control circuit at the pre-determined threshold voltage levels.

3. The assembly of claim 1 wherein the pre-determined amounts of progressive attenuation provided is a constant amount at each of the pre-determined threshold voltage levels.

4. The assembly of claim 1 wherein the pre-determined amounts of progressive attenuation introduced into the output signal is approximately 1-10 dB at each of the pre-determined threshold voltage levels.

5. The assembly of claim 1 further comprising an audio source adapted to provide the input voltage to the ultra low power dosimeter.

6. The assembly of claim 5 wherein the audio source is a portable audio device.

7. The assembly of claim 1 wherein the output signal is sent to the user through at least one earphone.

\* \* \* \* \*